(12) United States Patent
Eneman et al.

(10) Patent No.: US 12,432,985 B2
(45) Date of Patent: Sep. 30, 2025

(54) STRAINED SEMICONDUCTOR MONOCRYSTALLINE NANOSTRUCTURE

(71) Applicant: IMEC VZW, Leuven (BE)

(72) Inventors: Geert Eneman, Heverlee (BE); Basoene Briggs, Heverlee (BE); An De Keersgieter, Oud-Heverlee (BE); Anabela Veloso, Leuven (BE); Paola Favia, Overijse (BE)

(73) Assignee: IMEC VZW, Leuven (BE)

( * ) Notice: Subject to any disclaimer, the term of this patent is extended or adjusted under 35 U.S.C. 154(b) by 180 days.

(21) Appl. No.: 17/241,318

(22) Filed: Apr. 27, 2021

(65) Prior Publication Data

US 2021/0336057 A1    Oct. 28, 2021

(30) Foreign Application Priority Data

Apr. 27, 2020   (EP) .................................... 20171623

(51) Int. Cl.
*H10D 30/69*   (2025.01)
*H01L 21/02*   (2006.01)
(Continued)

(52) U.S. Cl.
CPC ..... *H10D 30/797* (2025.01); *H01L 21/02532* (2013.01); *H01L 21/0259* (2013.01);
(Continued)

(58) Field of Classification Search
CPC ........... H01L 29/7848; H01L 21/02532; H01L 21/0259; H01L 21/02603; H01L 29/0665;
(Continued)

(56) References Cited

U.S. PATENT DOCUMENTS

| 7,341,787 B2 | 3/2008 | Krautbauer et al. |
| 7,795,122 B2 | 9/2010 | Bu et al. |

(Continued)

FOREIGN PATENT DOCUMENTS

| CN | 104711675 A | 6/2015 |
| CN | 108155101 A | 6/2018 |

OTHER PUBLICATIONS

Extended European Search Report and Written Opinion, EP Application No. 20171623.0, mailed Oct. 13, 2020, 10 pages.
(Continued)

*Primary Examiner* — Jay C Kim
*Assistant Examiner* — Woo K Lee
(74) *Attorney, Agent, or Firm* — McDonnell Boehnen Hulbert & Berghoff LLP

(57) ABSTRACT

A semiconductor structure comprises a semiconductor substrate having a top layer and one or more semiconductor monocrystalline nanostructures. Each nanostructure has a first and a second extremity defining an axis parallel to the top surface of the semiconductor substrate and separated therefrom by a distance, and a source structure epitaxially grown on the first extremity and a drain structure epitaxially grown on the second extremity. The source and drain structures are made of a p-doped (or alternatively n-doped) semiconductor monocrystalline material having a smaller (or alternatively larger) unstrained lattice constant than the unstrained lattice constant of the semiconductor monocrystalline material making the semiconductor monocrystalline nanostructure on which they are grown, thereby creating compressive (or alternatively tensile) strain in that semiconductor monocrystalline nanostructure.

22 Claims, 3 Drawing Sheets

(51) Int. Cl.
  *H10D 30/01* (2025.01)
  *H10D 30/43* (2025.01)
  *H10D 30/67* (2025.01)
  *H10D 62/10* (2025.01)
  *H10D 62/822* (2025.01)

(52) U.S. Cl.
  CPC ..... *H01L 21/02603* (2013.01); *H10D 30/014* (2025.01); *H10D 30/031* (2025.01); *H10D 30/43* (2025.01); *H10D 30/6713* (2025.01); *H10D 30/6735* (2025.01); *H10D 30/6757* (2025.01); *H10D 62/118* (2025.01); *H10D 62/121* (2025.01); *H10D 62/822* (2025.01)

(58) Field of Classification Search
  CPC .............. H01L 29/0673; H01L 29/165; H01L 29/42392; H01L 29/66439; H01L 29/66742; H01L 29/775; H01L 29/78618; H01L 29/78696
  See application file for complete search history.

(56) References Cited

U.S. PATENT DOCUMENTS

| | | | |
|---|---|---|---|
| 9,000,559 | B2 | 4/2015 | Ueda |
| 9,024,364 | B2 | 5/2015 | Okano |
| 9,245,953 | B2 | 1/2016 | Loubet et al. |
| 9,577,038 | B1* | 2/2017 | Doris ............... H10D 30/6212 |
| 10,243,040 | B1 | 3/2019 | Park et al. |
| 10,263,077 | B1 | 4/2019 | Reboh et al. |
| 10,541,136 | B2 | 1/2020 | Mazur et al. |
| 2018/0047832 | A1 | 2/2018 | Tapily et al. |
| 2019/0067447 | A1 | 2/2019 | Zhou |
| 2020/0020774 | A1 | 1/2020 | Lee et al. |
| 2020/0091287 | A1* | 3/2020 | Glass ............... H10D 30/6757 |
| 2020/0105871 | A1 | 4/2020 | Glass et al. |
| 2021/0066455 | A1 | 3/2021 | Lee et al. |
| 2021/0234020 | A1* | 7/2021 | Mochizuki ........ H01L 29/42392 |
| 2021/0328012 | A1* | 10/2021 | Tsai ............... H01L 21/02535 |
| 2021/0336002 | A1 | 10/2021 | Loo et al. |
| 2022/0199797 | A1* | 6/2022 | Naskar ............. H10D 30/6729 |

OTHER PUBLICATIONS

Kim, Kihwan, and Saeroonter Oh. "Strain effectiveness of gate-all-around silicon transistors with various surface orientations and cross-sections." Journal of Semiconductor Technology and Science 19, No. 1 (2019): 24-29.
Dash, Tara Prasanna, Suprava Dey, Sanghamitra Das, Eleena Mohapatra, Jhansirani Jena, and Chinmay Kumar Maiti. "Strain-engineering in nanowire field-effect transistors at 3 nm technology node." Physica E: Low-dimensional Systems and Nanostructures 118 (2020): 113964.
Huang, Yu-Shiang, Fang-Liang Lu, Ya-Jui Tsou, Hung-Yu Ye, Shih-Ya Lin, Wen-Hung Huang, and C. W. Liu. "Vertically stacked strained 3-GeSn-nanosheet pGAAFETs on Si using GeSn/Ge CVD epitaxial growth and the optimum selective channel release process." IEEE Electron Device Letters 39, No. 9 (2018): 1274-1277.
Barraud, S., M. Cassé, L. Gaben, P. Nguyen, J. M. Hartmann, M. P. Samson, V. Maffini-Alvaro et al. "Opportunities and challenges of nanowire-based CMOS technologies." In 2015 IEEE SOI-3D-Subthreshold Microelectronics Technology Unified Conference (S3S), pp. 1-3. IEEE, 2015.
Jeon, Jihee, Akihiro Suzuki, Kouta Takahashi, Osamu Nakatsuka, and Shigeaki Zaima. "Development of in-situ Sb- Doped Ge 1-x Sn x Epitaxial Layers for Source/Drain Stressor of Strained Ge Transistors." In 2017 IEEE Electron Devices Technology and Manufacturing Conference (EDTM), pp. 249-251. IEEE.
Tahini, H. A., Alexander Chroneos, R. W. Grimes, and Udo Schwingenschlogl. "Co-doping with antimony to control phosphorous diffusion in germanium." Journal of Applied Physics 113, No. 7 (2013): 073704.
Bennett, Nick S., A. J. Smith, R. M. Gwilliam, R. P. Webb, B. J. Sealy, Nick EB Cowern, L. O'Reilly, and P. J. McNally. "Antimony for n-type metal oxide semiconductor ultrashallow junctions in strained Si: A superior dopant to arsenic?." Journal of Vacuum Science & Technology B: Microelectronics and Nanometer Structures Processing, Measurement, and Phenomena 26, No. 1 (2008): 391-395.
Oehme, M., J. Werner, and E. Kasper. "Molecular beam epitaxy of highly antimony doped germanium on silicon." Journal of Crystal Growth 310, No. 21 (2008): 4531-4534.
Capogreco, E., L. Witters, H. Arimura, F. Sebaai, C. Porret, A. Hikavyy, R. Loo et al. "First demonstration of vertically stacked gate-all-around highly strained germanium nanowire pFETs." IEEE Transactions on Electron Devices 65, No. 11 (2018): 5145-5150.

* cited by examiner

STRAINED SEMICONDUCTOR MONOCRYSTALLINE NANOSTRUCTURE

CROSS-REFERENCE TO RELATED APPLICATIONS

The present application is a non-provisional patent application claiming priority to European Patent Application No. 20171623.0, filed Apr. 27, 2020, the contents of which are hereby incorporated by reference.

FIELD OF THE DISCLOSURE

This application relates to semiconductor structures and, in particular, to semiconductor monocrystalline nanostructures such as nanowires and nanosheets, and to methods for producing the same.

BACKGROUND

To compete with the best performances of fin field-effect transistors (FinFETs) and planar FETs, charge mobility in semiconductor monocrystalline nanostructures, such as nanowires and nanosheets, as used in complementary field-effect transistors (CFETs), must be enhanced. One way to enhance mobility is by introducing strain of an adequate type in the nanostructure.

E. Capogreco et al. (IEEE transactions on electron devices, vol. 65, No. 11, November 2018, 5145-5150) disclose 45 nm fin pitch compressively strained p-type Ge gate-all-around devices fabricated on SiGe strain-relaxed-buffers on 300 mm wafers. The uniaxial strain obtained along the Ge wire originates from the lattice mismatch between the Ge source/drain and the SiGe strain-relaxed-buffer on which they are grown. Such devices rely on the bottom-up growth of source and drain structures from the substrate. Such a growth process is, however, not preferred for emerging semiconductor monocrystalline nanostructures, including CFETs. Instead, epitaxially growing the source and the drain directly from the extremities of the channel is currently preferred in such devices as it allows the use of different source/drain materials with different doping types for different superimposed nanostructures. It is, however, not yet clear if strain, let alone an adequate type of strain, can be introduced by source/drain material epitaxially grown from these extremities.

SUMMARY

An aspect of this disclosure provides suitable semiconductor structures having suitable charge mobility and methods for obtaining such semiconductor structures.

In a first aspect, a semiconductor structure comprises:
a. A semiconductor substrate having a top surface,
b. One or more semiconductor monocrystalline nanostructures, each having a first and a second extremity defining an axis parallel to the top surface of the semiconductor substrate and separated therefrom by a non-zero distance, each nanostructure having a source structure epitaxially grown on the first extremity and a drain structure epitaxially grown on the second extremity,
wherein the source and drain structures are made of a p-doped semiconductor monocrystalline material having a smaller unstrained lattice constant than the unstrained lattice constant of the semiconductor monocrystalline material making the semiconductor monocrystalline nanostructure on which they are grown, thereby creating compressive strain in that semiconductor monocrystalline nanostructure, or wherein the source and drain structures are made of an n-doped semiconductor monocrystalline material having a larger unstrained lattice constant than the unstrained lattice constant of the semiconductor monocrystalline material making the semiconductor monocrystalline nanostructure on which they are grown, thereby creating tensile strain in that semiconductor monocrystalline nanostructure.

In a second aspect, a method for forming a semiconductor structure according to any embodiment of the first aspect comprises:
a. Providing a semiconductor substrate having a top surface,
b. Providing one or more semiconductor monocrystalline nanostructures, each having a first and a second extremity defining an axis parallel to the top surface of the semiconductor substrate and separated therefrom by a non-zero distance,
c. Growing epitaxially on each semiconductor monocrystalline nanostructures a source structure on the first extremity, and a drain structure on the second extremity, wherein the source and drain structures are made of a p-doped material having a smaller unstrained lattice constant than the unstrained lattice constant of the semiconductor monocrystalline material making the semiconductor monocrystalline nanostructure on which they are grown, thereby creating compressive strain in that semiconductor monocrystalline nanostructure, or wherein the source and drain structures are made of an n-doped material having a larger unstrained lattice constant than the unstrained lattice constant of the semiconductor monocrystalline material making the semiconductor monocrystalline nanostructure on which they are grown, thereby creating tensile strain in that semiconductor monocrystalline nanostructure.

A third aspect relates to the use of epitaxially grown source and drain structures made of a p-doped semiconductor monocrystalline material having a first unstrained lattice constant to induce compressive strain in a semiconductor monocrystalline nanostructure made of a second semiconductor monocrystalline material having a second unstrained lattice constant, larger than the first unstrained lattice constant.

A fourth aspect relates to the use of epitaxially grown source and drain structures made of an n-doped material having a first unstrained lattice constant to induce tensile strain in a semiconductor monocrystalline nanostructure made of a second semiconductor monocrystalline material having a second unstrained lattice constant, smaller than the first unstrained lattice constant.

In example embodiments, compressive strain can be induced in semiconductor monocrystalline nanostructures forming p-type transistors and tensile strain can be induced in semiconductor monocrystalline nanostructures forming n-type transistors.

In example embodiments, proper strain can be introduced by growing a source and a drain structure from the side extremities of nanostructures, thereby making the structure compatible with CFET technology.

Example embodiments facilitate the use of materials already in use in semiconductor technology and, therefore, necessitate little adaptation to current manufacturing practices.

Example embodiments facilitate boosting charge mobility and improving performance in FETs using (lateral) semiconductor monocrystalline nanostructure as channels.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above, other characteristics, and features will become apparent from the following detailed description, taken in conjunction with the accompanying drawings, which illustrate, by way of example, various principles. This description is given for the sake of example only, without limiting the scope of the claims. The reference figures quoted below refer to the attached drawings.

BRIEF DESCRIPTION OF THE FIGURES

The above, as well as additional features, will be better understood through the following illustrative and non-limiting detailed description of example embodiments, with reference to the appended drawings.

Figure 1:
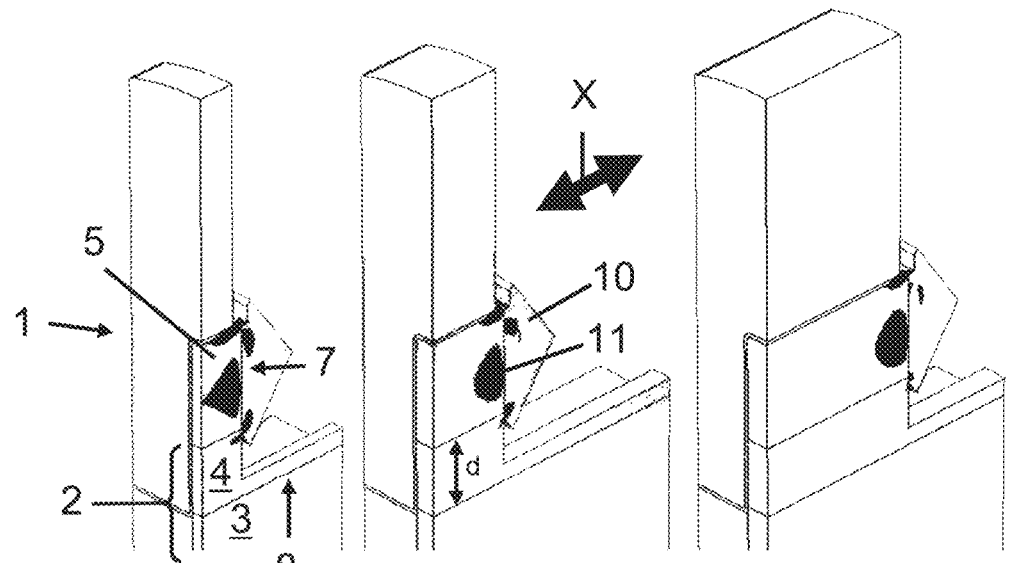
FIG. 1 illustrates schematic representations of perspective views of the first aspect used in TCAD simulations of induced longitudinal stress, in accordance with example embodiments.

In the different figures, the same reference signs refer to the same or analogous elements.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps or components, or groups thereof. The term "comprising" therefore covers the situation where only the stated features are present and the situation where these features and one or more other features are present. The word "comprising" therefore also includes as one embodiment that no further components are present. Thus, the scope of the expression "a device comprising A and B" should not be interpreted as being limited to devices consisting only of components A and B and that other components can be included.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed aspects require more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the claims, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out disclosed aspects.

In the description provided herein, numerous specific details are set forth. However, it is understood that embodiments may be practiced without these specific details. In other instances, well-known methods, structures, and techniques have not been shown in detail in order not to obscure an understanding of this description.

The following terms are provided solely as an aid to understanding the disclosure.

As used herein and unless provided otherwise, the term "nanostructure" refers to a structure having at least one of its three dimensions (length, width, or height) which measures from 1 to 100 nm.

As used herein, the length (l), width (w), and height (h) of a three-dimensional object, such as a nanostructure, are respectively the longest of both horizontal dimensions (i.e., parallel to a main surface (i.e., the top surface) of the substrate), the shortest of both horizontal dimensions, and the vertical dimension (i.e., perpendicular to a main surface (i.e., the top surface) of the substrate).

As used herein and unless provided otherwise, the term "nanowire" refers to a structure having its two smallest dimensions measuring from 1 to 100 nm, having the ratio of its larger dimension to the second larger dimension greater than two, and having a ratio between its second largest dimension and its shortest dimension from 1 to 2, and in some examples from 1 to 1.5.

As used herein and unless provided otherwise, the term "nanosheet" refers to a structure having its smallest dimension measuring from 1 to 100 nm, and having the ratio of its second largest dimension to its third largest dimension greater than 2.

A nanostructure is typically present in one of two orientations being lateral and vertical. A lateral nanostructure has a lateral orientation towards the substrate or substrate surface, i.e., its longest dimension (here, its length) is parallel thereto. It may also be referred to as a horizontal nanostructure. A vertical nanostructure has its orientation perpendicular or vertical towards that substrate or substrate surface, i.e., its longest dimension (here, its height) is perpendicular thereto.

The nanostructures referred to herein are, in some examples, lateral (or horizontal) nanostructures. Each nanostructure typically functions as a channel in a field-effect transistor.

As used herein, a strained structure is a structure that is deformed under the action of an applied mechanical force, called stress. In the absence of this force, at equilibrium, the structure will be in its relaxed (i.e., unstrained) state. In the context of the disclosure, the strained structure will typically be a strained monocrystalline structure adopting (strained) lattice constants differing from its unstrained (i.e., relaxed) lattice constants (cf. infra). The deformation of the lattice is the result of a stress component applied to the material, leading to a (e.g., compressive or tensile) strain. Such an external stress occurs when the material is, for example, epitaxially grown on a monocrystalline surface, which has a lattice constant that is different from the corresponding unstrained (i.e., relaxed) lattice constant of the material making up the layer.

As used herein, a distinction is made between unstrained lattice constants, i.e., the relaxed lattice constants of the material in the absence of stress, and actual lattice constants of a monocrystalline material or surface, i.e., the lattice constants of the monocrystalline material or surface as it is present in the structure of interest and which may be equal to or different from its unstrained lattice constants.

Aspects will now be described by a detailed description of several embodiments. It is clear that other embodiments can be configured according to the knowledge of persons skilled in the art without departing from the technical teaching provided herein.

Reference will be made to transistors. These are three-terminal devices having a first main electrode such as a drain, a second main electrode such as a source, and a control electrode such as a gate for controlling the flow of electrical charges between the first and second main electrodes.

Contrary to what is observed in traditional source/drain stressors, it was surprisingly realized that epitaxially growing a source structure on the first extremity and a drain structure on the second extremity of a nanostructure, such as a nanowire or a nanosheet, leads to a tensile longitudinal channel strain when the source/drain structures have a larger unstrained lattice constant than the unstrained lattice constant of the channel. From this observation and additional simulations and experiments, the various aspects disclosed herein have been arrived at.

A first aspect relates to a semiconductor structure comprising:
  a. A semiconductor substrate having a top surface,
  b. One or more semiconductor monocrystalline nanostructures, each having a first and a second extremity defining an axis parallel to the top surface of the semiconductor substrate and separated therefrom by a non-zero distance, each nanostructure having a source structure epitaxially grown on the first extremity and a drain structure epitaxially grown on the second extremity, Wherein the source and drain structures are made of a p-doped semiconductor monocrystalline material having a smaller unstrained lattice constant than the unstrained lattice constant of the semiconductor monocrystalline material making the semiconductor monocrystalline nanostructure on which they are grown, thereby creating compressive strain in that semiconductor monocrystalline nanostructure, or wherein the source and drain structures are made of an n-doped semiconductor monocrystalline material having a larger unstrained lattice constant than the unstrained lattice constant of the semiconductor monocrystalline material making the semiconductor monocrystalline nanostructure on which they are grown, thereby creating tensile strain in that semiconductor monocrystalline nanostructure.

Stated differently, the first aspect relates to a semiconductor structure comprising:
  a. A semiconductor substrate having a top surface,
  b. One or more semiconductor monocrystalline nanostructures, each having a first and a second extremity defining an axis parallel to the top surface of the semiconductor substrate and separated therefrom by a non-zero distance, each nanostructure having a source structure on the first extremity and a drain structure on the second extremity, wherein a surface of the source structure in contact with a surface of the first extremity has a crystal lattice structure matching the crystal lattice structure of the surface of the first extremity, wherein a surface of the drain structure in contact with a surface of the second extremity has a crystal lattice structure matching the crystal lattice structure of the surface of the second extremity, wherein the source and drain structures are made of a monocrystalline p-doped semiconductor monocrystalline material having a smaller unstrained lattice constant than the unstrained lattice constant of the semiconductor monocrystalline material making the semiconductor monocrystalline nanostructure on which they are present, thereby creating compressive strain in that semiconductor monocrystalline nanostructure, or wherein the source and drain structures are made of a monocrystalline n-doped semiconductor monocrystalline material having a larger unstrained lattice constant than the unstrained lattice constant of the semiconductor monocrystalline material making the semiconductor monocrystalline nanostructure on which they are present, thereby creating tensile strain in that semiconductor monocrystalline nanostructure.

Both formulations of the first aspect are herein considered equivalent because a first structure epitaxially grown on a second structure is a monocrystalline structure wherein a surface thereof in contact with a surface of the second structure has a crystal lattice structure matching the crystal lattice structure of the surface of the second structure.

Also, instead of describing the first and the second extremity as defining an axis parallel to the top surface of the semiconductor substrate and separated therefrom by a non-zero distance, it is equivalent to describe the first and the second extremity as being separated by the length of the semiconductor monocrystalline nanostructure, the length being parallel to the top surface of the semiconductor substrate and separated therefrom by a non-zero distance.

In embodiments, the semiconductor structure of the first aspect may comprise a plurality of group IV semiconductor monocrystalline nanostructures stacked above one another. For instance, the semiconductor structure may comprise an n-type group IV semiconductor monocrystalline nanostructure stacked above a p-type group IV semiconductor monocrystalline nanostructure, or vice versa.

In embodiments, the semiconductor structure of the first aspect may be a CFET.

For instance, the CFET may comprise an n-type (or p-type) group IV semiconductor monocrystalline nanowire situated above a p-type (or n-type) group IV semiconductor monocrystalline fin. As another example, the CFET may comprise an n-type (or p-type) group IV semiconductor monocrystalline nanowire or nanosheet situated above a p-type (or n-type) group IV semiconductor monocrystalline nanowire or nanosheet.

In embodiments, the semiconductor substrate may be a group IV semiconductor substrate. For instance, the substrate can be selected from Si, Ge, $Si_{1-z}Ge_z$ wherein $0<z<1$, Sn, $Ge_{1-w}Sn_w$ wherein $0<w<1$, $Si_iGe_{1-i-j}Sn_j$, wherein $0<i<1$ and $0<j<1$, and $0<i+j<1$. Preferably, it is selected from Si, Ge, and $Si_{1-z}Ge_z$ wherein $0<z<1$. In some examples, the substrate may be a wafer made of such a material. In embodiments, the substrate may comprise one or more fins and each of the one or more semiconductor monocrystalline nanostructures may be directly above a fin.

In embodiments, a dielectric layer may be present on the semiconductor substrate. In particular, the dielectric layer may at least overlap with the vertical projection of the source and drain structures on the substrate. Before the growth of the source and drain structures, the presence of the dielectric layer on the substrate and below where the source and drain structures will be grown prevents epitaxial growth from the substrate. Although epitaxial growth from the substrate can be tolerated since it would not impact the strain obtained in the semiconductor monocrystalline nanostructure, it is also not necessary.

In embodiments, the dielectric layer on the semiconductor substrate may be an oxide of the semiconductor monocrystalline material forming the substrate.

The dielectric layer typically extends laterally beyond the extremities of the semiconductor monocrystalline nanostructures. The presence of the dielectric layer beyond these extremities assures that the source and drain, during their formation, are not epitaxially grown from the surface of the substrate but well from a surface of the first extremity and second extremity, respectively.

In embodiments, the thickness (i.e., the height) of the dielectric layer may be from 1 to 50 nm, from 5 to 50 nm, from 10 to 50 nm, and from 10 to 35 nm.

The one or more semiconductor monocrystalline nanostructures are not limited in numbers.

In embodiments, the one or more semiconductor monocrystalline nanostructures may comprise a first and a second adjacent, co-planar, and separated semiconductor monocrystalline nanostructure, wherein neither the drain structure nor the source structure of the first nanostructure touches either the drain structure or the source structure of the second semiconductor monocrystalline nanostructure. This facilitates avoiding epitaxial merging, which in turn facilitates avoiding typical defects associated therewith.

In any embodiment, each of the semiconductor monocrystalline nanostructures is made of a semiconductor monocrystalline material. In an example, the semiconductor monocrystalline material is a group IV semiconductor monocrystalline material. Within examples, the group IV semiconductor monocrystalline material is selected from Si, $Si_{1-y}Ge_y$, and Ge, wherein $0<y<1$.

In embodiments, at least one of the one or more semiconductor monocrystalline nanostructures is selected from nanowires and nanosheets.

In embodiments, where at least one of the one or more semiconductor monocrystalline nanostructures is selected from nanowires and nanosheets, the semiconductor structure may be a complementary field-effect transistor. In such embodiments, the substrate typically comprises one or more fins and each of the one or more semiconductor monocrystalline nanostructures is positioned directly above a fin.

In embodiments, the length of each semiconductor monocrystalline nanostructure may be from 5 nm to 200 nm or from 10 to 100 nm.

In some examples, the length of each semiconductor monocrystalline nanostructure corresponds to the distance between their first and their second extremity. The effect of this aspect is strongest with a shorter distance between the extremities because the strain induced is more important at the extremities than at mid-distance between the extremities.

In embodiments, the height of each semiconductor monocrystalline nanostructure may be from 3 nm to 200 nm, from 5 nm to 200 nm, from 10 nm to 60 nm, or 15 to 50 nm.

In embodiments, the width of each semiconductor monocrystalline nanostructure may be from 3 to 200 nm.

In embodiments, the semiconductor monocrystalline nanostructures may have a ratio length on height of from 1 to 10, from 2 to 10, or from 2 to 4.

Typically, each semiconductor monocrystalline nanostructure will comprise a channel of a field-effect transistor. In contact with that channel and covering it (e.g., entirely), a gate structure and dielectric spacers will typically be present. The dielectric spacers facilitate the prevention of epitaxial growth away from the extremities of the semiconductor monocrystalline nanostructure.

In embodiments, the non-zero distance separating the top surface of the semiconductor substrate from the semiconductor monocrystalline nanostructures may be from 5 to 50 nm, from 10 to 50 nm, or from 15 to 35 nm.

In embodiments where the substrate comprises one or more fins and each of the one or more semiconductor monocrystalline nanostructures is directly above one fin, the non-zero distance may be the distance between the top of the fin and the bottom of the semiconductor monocrystalline nanostructure.

The source structure and the drain structure are epitaxially grown on the first extremity and the second extremity, respectively.

As a result of these structures being epitaxially grown on their respective extremity, a surface of the source/drain structure in contact with a surface of the first/second extremity has a crystal lattice structure matching the crystal lattice structure of the surface of the first/second extremity.

In an embodiment, the source and drain structures are made of a monocrystalline p-doped semiconductor monocrystalline material having a smaller unstrained lattice constant than the unstrained lattice constant of the semiconductor monocrystalline material making the semiconductor monocrystalline nanostructure on which they are present, thereby creating compressive strain in that semiconductor monocrystalline nanostructure.

For instance, the source and drain structures may comprise:
p-doped $Si_{1-x}Ge_x$ when the semiconductor monocrystalline nanostructure on which they are grown comprises $Si_{1-y}Ge_y$ wherein $x<y\leq1$, or
p-doped SiC when the semiconductor monocrystalline nanostructure on which they are grown are made of Si or $Si_{1-y}Ge_y$ with $0<y\leq1$,
thereby creating compressive strain in that nanostructure.

In another embodiment, the source and drain structures are made of a monocrystalline n-doped semiconductor monocrystalline material having a larger unstrained lattice constant than the unstrained lattice constant of the semiconductor monocrystalline material making the semiconductor monocrystalline nanostructure on which they are present, thereby creating tensile strain in that semiconductor monocrystalline nanostructure.

For instance, the source and drain structures may comprise:
n-doped $Si_{1-x}Ge_x$ when the semiconductor monocrystalline nanostructure on which they are grown comprises $Si_{1-y}Ge_y$ wherein $x>y\geq0$, or
n-doped $Ge_{1-w}Sn_w$ wherein $0<w<0.1$, when the semiconductor monocrystalline nanostructure on which they are grown are made of Ge or $Si_{1-y}Ge_y$ with $0\leq y\leq1$, or
n-doped $Si_iGe_{1-i-j}Sn_j$, wherein $0<i<j<1$, and $0<i+j<1$ when the semiconductor monocrystalline nanostructure (5) on which they are grown are made of Ge.

In embodiments, the group IV semiconductor of the source and drain structures may comprise:
n-doped $Si_{1-x}Ge_x$ when the semiconductor monocrystalline nanostructure on which they are grown comprises $Si_{1-y}Ge_y$ wherein $x>y\geq0$, or
n-doped $Ge_{1-w}Sn_w$ wherein $0<w<0.1$ when the semiconductor monocrystalline nanostructure on which they are grown are made of Ge or $Si_{1-y}Ge_y$ with $0\leq y\leq1$, or
n-doped $Si_iGe_{1-i-j}Sn_j$, wherein $0<i<1$, $0<j<1$, and $0<i+j<1$, wherein i and j are chosen in such a way that the lattice constant of $Si_iGe_{1-i-j}Sn_j$ is larger than the lattice constant of Ge, when the semiconductor monocrystalline nanostructure on which they are grown are made of Ge.

In embodiments, the source and drain structures may comprise n-doped $Si_{1-x}Ge_x$ while the semiconductor monocrystalline nanostructure on which they are grown comprise Si wherein $0.70\geq x>0$, for instance $0.70\geq x\geq 0.2$, or $0.70\geq x\geq 0.40$.

In embodiments, the source and drain structures may each display a surface, other than the interface with the extremity of nanostructure on which they are grown, which is parallel to the surface forming that extremity.

In embodiments, the source and drain structures may each display two intersecting planes that form an angle, wherein the angle of the source structure points away from the angle of the drain structure.

In embodiments wherein the source and drain structures comprise n-doped material, the n-doping may result from the presence of one or more of Sb and Bi, and optionally one or more of As and P. Such a doping helps to increase the unstrained lattice constant of the source and drain material beyond the unstrained lattice constant of the semiconductor monocrystalline material making the semiconductor monocrystalline nanostructure on which the source and the drain are grown tensile strained.

In embodiments, the epitaxial source and drain structures may be made of a group IV semiconductor doped with one or more of Sb and Bi, and one or more of As and P. The presence of As and/or P helps to achieve a larger doping concentration than would be possible in their absence.

In embodiments, [Sb]+[Bi]>[As]+[P]. This facilitates obtaining obtain tensile strain. And in some examples [Sb]+[Bi])>1.1([As]+[P].

In embodiments, $[Sb]+[Bi]>10^{20}$ $cm^{-3}$, and in some examples $[Sb]+[Bi]>2*10^{20}$ $cm^{-3}$.

In embodiments, $[As]+[P]>10^{20}$ $cm^{-3}$, and in some examples $[As]+[P]>2*10^{20}$ $cm^{-3}$.

In any embodiment, the dopant concentration in the group IV semiconductor of the source and drain structures may be at least $10^{20}$ $cm^{-3}$, and in some examples above $2*10^{20}$ $cm^{-3}$.

When compressive strain is created in the semiconductor monocrystalline nanostructure, this compressive strain is at least present in the longitudinal direction of the semiconductor monocrystalline nanostructure, i.e., along the length thereof. In embodiments, the compressive strain is also present in the direction perpendicular to the substrate. In embodiments, the compressive strain is also present in the direction parallel to the substrate but perpendicular to the length of the semiconductor monocrystalline nanostructure. Typically, the compressive strain is present in all three directions.

Similarly, when tensile strain is created in the semiconductor monocrystalline nanostructure, this tensile strain is at least present in the longitudinal direction of the semiconductor monocrystalline nanostructure, i.e., along the length thereof. In embodiments, the tensile strain is also present in the direction perpendicular to the substrate. In embodiments, the tensile strain is also present in the direction parallel to the substrate but perpendicular to the length of the semiconductor monocrystalline nanostructure. Typically, the tensile strain is present in all three directions.

A second aspect relates to a method for forming a semiconductor structure according to any embodiment of the first aspect, comprising:
 a. Providing a semiconductor substrate having a top surface,
 b. Providing one or more semiconductor monocrystalline nanostructures, each having a first and a second extremity defining an axis parallel to the top surface of the semiconductor substrate and separated therefrom by a non-zero distance,
 c. Growing epitaxially on each semiconductor monocrystalline nanostructures a source structure on the first extremity, and a drain structure on the second extremity,
 wherein the source and drain structures are made of a p-doped material having a smaller unstrained lattice constant than the unstrained lattice constant of the semiconductor monocrystalline material making the semiconductor monocrystalline nanostructure on which they are grown, thereby creating compressive strain in that semiconductor monocrystalline nanostructure, or wherein the source and drain structures are made of an n-doped material having a larger unstrained lattice constant than the unstrained lattice constant of the semiconductor monocrystalline material making the semiconductor monocrystalline nanostructure on which they are grown, thereby creating tensile strain in that semiconductor monocrystalline nanostructure.

Any feature of the second aspect may be as correspondingly described in any embodiment of the first aspect. In particular, the semiconductor structure, the assembly, the semiconductor substrate, the dielectric layer, the one or more semiconductor monocrystalline nanostructures, their extremities, the non-zero distance, the source structure, and the drain structure may be as correspondingly described in the first aspect.

A third aspect relates to the use of epitaxially grown source and drain structures made of a p-doped semiconductor monocrystalline material having a first unstrained lattice constant to induce compressive strain in a semiconductor monocrystalline nanostructure made of a second semiconductor monocrystalline material having a second unstrained lattice constant, larger than the first unstrained lattice constant.

Any feature of the third aspect may be as correspondingly described in any embodiment of the first or second aspect. In particular, the source and drain structures, their epitaxial growth, the p-doped semiconductor monocrystalline material making them, the semiconductor monocrystalline nanostructure, and the second semiconductor monocrystalline material may be as correspondingly described in any embodiment of the first and second aspect.

A fourth aspect relates to the use of epitaxially grown source and drain structures made of an n-doped material having a first unstrained lattice constant to induce tensile strain in a semiconductor monocrystalline nanostructure made of a second semiconductor monocrystalline material having a second unstrained lattice constant, smaller than the first unstrained lattice constant.

Any feature of the fourth aspect may be as correspondingly described in any embodiment of the first or second aspect. In particular, the source and drain structures, their epitaxial growth, the n-doped semiconductor monocrystalline material making them, the semiconductor monocrystalline nanostructure, and the second semiconductor monocrystalline material may be as correspondingly described in any embodiment of the first and second aspect.

Figure 2:
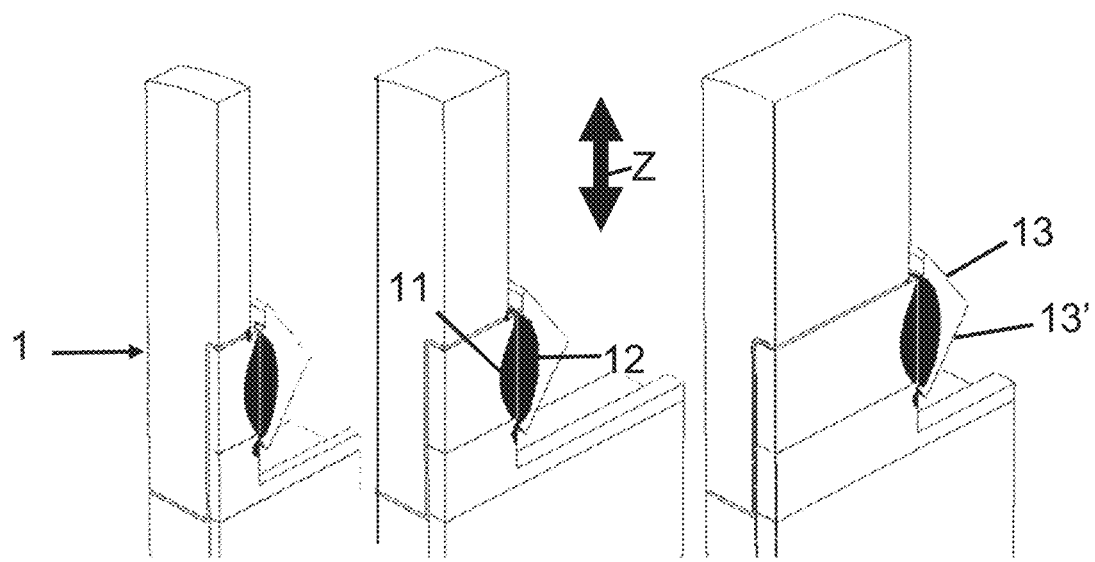
FIG. 2 illustrates schematic representations of perspective views of the first aspect used in TCAD simulations of induced vertical stress, in accordance with example embodiments.
Figure 3:
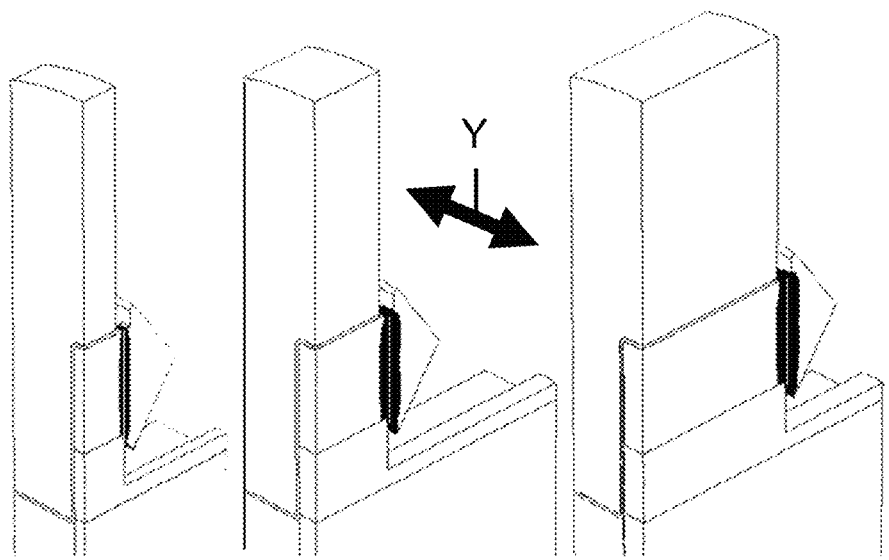
FIG. 3 illustrates schematic representations of perspective views of the first aspect used in TCAD simulations of induced stress in a direction perpendicular to the longitudinal and the vertical direction, in accordance with example embodiments.

We now refer to FIGS. 1-3 where three examples of semiconductor structures (1) are shown per figure, each comprising:
 a. An assembly (2) formed by a semiconductor substrate (3) having an optional dielectric layer (4) thereon, the semiconductor substrate (3) having a top surface (8),
 b. One or more semiconductor monocrystalline nanostructures (5), each having a first (6) and a second (7) extremity defining an axis parallel to the top surface (8) of the semiconductor substrate (3) and separated therefrom by a non-zero distance (d), each nanostructure (5) having a source (9) structure epitaxially grown on the first (6) extremity and a drain (10) structure epitaxially grown on the second (7) extremity,
 Wherein the source (9) and drain (10) structures are made of a p-doped semiconductor monocrystalline material having a smaller unstrained lattice constant than the unstrained lattice constant of the semiconductor monocrystalline material making the semiconductor monocrystalline nanostructure (5) on which they are grown, thereby creating compressive strain in that semiconductor monocrystalline nanostructure (5), or wherein the source (9) and drain (10) structures are made of an n-doped semiconductor monocrystalline material having a larger unstrained lattice constant than the unstrained lattice constant of the semiconductor monocrystalline material making the semiconductor monocrystalline nanostructure (5) on which they are grown, thereby creating tensile strain (11) in that semiconductor monocrystalline nanostructure (5).

In each figure, these three semiconductor structures (1) differ in the length of the semiconductor monocrystalline nanostructure (5) they comprise. The same three different structures are represented in each of FIGS. 1-3 but the strain induced in the structure is measured along a different direction in each of FIGS. 1-3.

In FIG. 1, the strain is measured in the longitudinal direction X.

In FIG. 2, the strain is measured in the vertical direction Z.

In FIG. 3, the strain is measured in the direction Y, perpendicular to X and Z.

In each of FIGS. 1-3, the right back quarter of three different silicon monocrystalline nanostructures (5), differing in length, are depicted. In other words, the right half is depicted, the back half is depicted, the left half is not depicted, and the front half is not depicted. In each figure, the nanostructure (5) on the left has a length of 28 nm, the nanostructure (5) in the middle has a length of 50 nm, and the nanostructure (5) on the right has a length of 100 nm. In each figure, the nanostructure (5) on the left has a width of 14 nm, the nanostructure (5) in the middle has a width of 24 nm, and the nanostructure (5) on the right has a width of 28 nm. The dimensions are given for illustration purposes. The substrate is, in each case, a silicon wafer and the dielectric layer (4) is $SiO_2$.

Only the back half of the drain (10), not its front half, is depicted. The drain (10) is in the case of FIGS. 1-3 made of $Si_{0.45}Ge_{0.55}$.

Visible in each of these figures are the two intersecting planes (13, 13') that form an angle.

Also visible from these figures is the fact that the drain (10) is grown from the nanostructure (5), not from the substrate. The presence of the optional dielectric layer (4) beyond the extremities assures that the source (9) and drain (10), during their formation, are not epitaxially grown from the surface of the substrate but well from a surface of the first (6) extremity and second (7) extremity.

The black spot shown in the nanostructure (5) represents tensile stress above $5.10^8$ Pa.

The black spot shown in the drain (10) represents compressive stress above $5.10^8$ Pa.

As can be seen in FIG. 1, longitudinal (X) tensile stress is mostly present at the extremity (7) and tends to decrease toward the center of the nanostructure (5).

As can be seen in FIG. 2, vertical (Z) tensile stress is mostly present at the extremity (7) and tends to decrease toward the center of the nanostructure (5).

As can be seen in FIG. 3, tensile stress (Y) in the direction perpendicular to X and Z is mostly present at the extremity (7) and tend to decrease toward the center of the nanostructure (5).

Decreasing tensile stress values toward the center of the nanostructure (5) (not depicted in the figure) have been observed.

It is noteworthy that the performed simulations indicate that the extent of the device's width has little or no influence on the measured stress.

Also noteworthy is that the strain close to the source (9) or drain (10) can reach 1% while the strain measured in the middle of the source (9) drain (10) axis can be lower than 0.2% for the longest 100 nm nanostructure (5).

Figure 4:
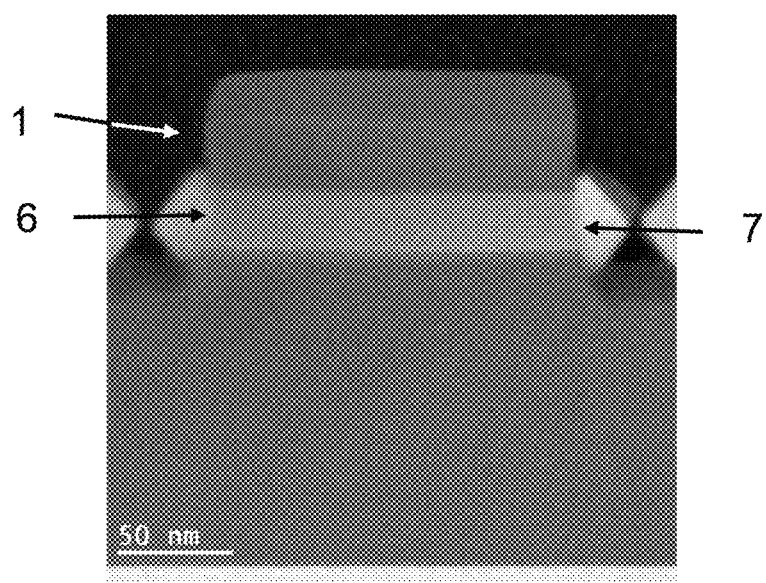
FIGS. 4 and 5 illustrate high-angular annular dark-field scanning transmission electron microscopy images of vertical cross-sections through semiconductor structures according to the first aspect, in accordance with example embodiments.
Figure 5:
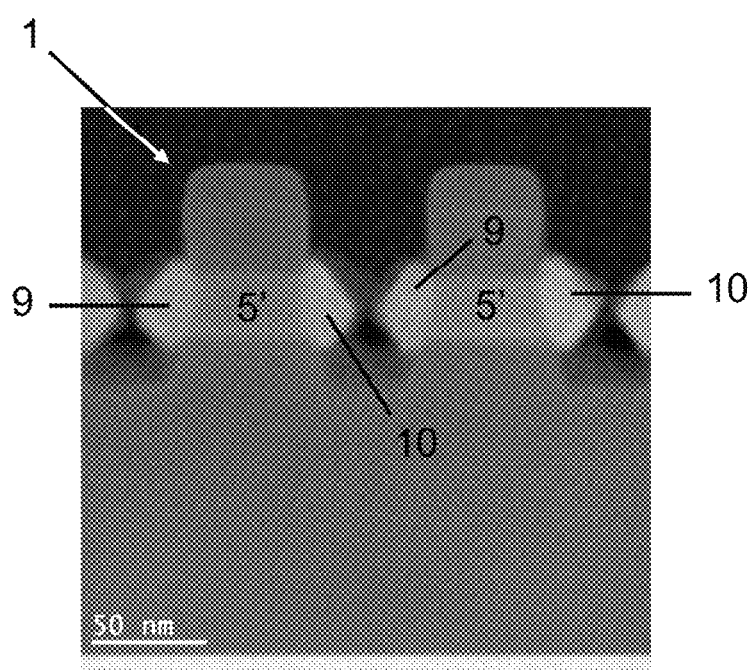

FIGS. 4 and 5 are high-angular dark-field scanning transmission electron microscopy images of samples prepared according to an embodiment wherein a silicon nanostructure (5) has $Si_{0.45}Ge_{0.55}$ grown on their extremities. In FIG. 4, the length of the silicon nanostructure (5) is about 150 nm and the height is about 30 nm. In FIG. 5, the one or more silicon monocrystalline nanostructures (5) comprise a first and a second adjacent, co-planar, and separated silicon monocrystalline nanostructure (5), wherein neither the drain (10) structure nor the source (9) structure of the first nanostructure (5) touches either the drain (10) structure or the source (9) structure of the second semiconductor monocrystalline nanostructure (5).

It is to be understood that although certain embodiments, specific constructions, and configurations, as well as materials, have been discussed herein, various changes or modifications in form and detail may be made without departing from the scope of claims. Steps may be added or deleted to the methods described herein.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A semiconductor structure comprising:
   a semiconductor substrate having a top surface; and
   a first semiconductor monocrystalline nanostructure co-planar to a second semiconductor monocrystalline nanostructure that is insulated from and adjacent to, the first semiconductor nanostructure, each nanostructure having a first and a second extremity separated by a length of the nanostructure parallel to the top surface of the semiconductor substrate and separated therefrom by a non-zero distance, each nanostructure having a source structure epitaxially grown on the first extremity and a drain structure epitaxially grown on the second extremity,
   wherein neither the source structure nor the drain structure of the first nanostructure contacts either the source structure or drain structure of the second nanostructure; and
   wherein the source and drain structures of each nanostructure comprise a p-doped semiconductor monocrystalline material that is different from the semiconductor monocrystalline material making the semiconductor monocrystalline nanostructure on which they are grown, thereby creating compressive strain such that the compressive strain is substantially in the longitudinal direction of the semiconductor monocrystalline nanostructure, or wherein the source and drain structures of each nanostructure comprise an n-doped semiconductor monocrystalline material that is different from the semiconductor monocrystalline material making the semiconductor monocrystalline nanostructure on which they are grown, thereby creating tensile strain such that the tensile strain is substantially in the longitudinal direction of the semiconductor monocrystalline nanostructure.

2. The semiconductor structure according to claim 1, wherein the source and drain structures comprise p-doped $Si_{1-x}Ge_x$ when the semiconductor monocrystalline nanostructure on which they are grown comprises $Si_{1-y}Ge_y$ wherein $x<y\leq1$.

3. The semiconductor structure according to claim 1, wherein the source and drain structures comprise p-doped SiC when the semiconductor monocrystalline nanostructures on which they are grown comprise Si or $Si_{1-y}Ge_y$ with $0<y\leq1$.

4. The semiconductor structure according to claim 1, wherein the source and drain structures comprise n-doped $Si_{1-x}Ge_x$ when the semiconductor monocrystalline nanostructure on which they are grown comprises $Si_{1-y}Ge_y$ wherein $x>y\geq0$.

5. The semiconductor structure according to claim 4, wherein the source and drain structures comprise n-doped $Si_{1-x}Ge_x$ while the semiconductor monocrystalline nanostructure on which they are grown comprise Si wherein $0.70\geq x>0$.

6. The semiconductor structure according to claim 1, wherein the source and drain structures comprise n-doped $Ge_{1-w}Sn_w$ wherein $0<w<0.1$ when the semiconductor monocrystalline nanostructure on which they are grown comprise Ge or $Si_{1-y}Ge_y$ with $0\leq y\leq1$.

7. The semiconductor structure according to claim 6, wherein the source and drain structures comprise n-doped $Si_{1-x}Ge_x$ while the semiconductor monocrystalline nanostructure on which they are grown comprise Si wherein $0.70\geq x>0$.

8. The semiconductor structure according to claim 1, wherein the source and drain structures comprise n-doped $Si_iGe_{1-i-j}$, wherein $0<i<j<1$, and $0<i+j<1$ when the semiconductor monocrystalline nanostructure on which they are grown comprise Ge.

9. The semiconductor structure according to claim 8, wherein the source and drain structures comprise n-doped $Si_{1-x}Ge_x$ while the semiconductor monocrystalline nanostructure on which they are grown comprise Si wherein $0.70 \geq x > 0$.

10. The semiconductor structure according to claim 1, wherein at least one of the first and second semiconductor monocrystalline nanostructures is selected from nanowires and nanosheets.

11. The semiconductor structure according to claim 5, wherein the semiconductor structure is a complementary field-effect transistor.

12. The semiconductor structure according to claim 1, wherein the source and drain structures each display two intersecting planes that form an angle, wherein the angle of the source structure points away from the angle of the drain structure.

13. The semiconductor structure according to claim 1, wherein the semiconductor monocrystalline nanostructures have a height ranging from 10 to 60 nm.

14. The semiconductor structure according to claim 1, wherein the semiconductor monocrystalline nanostructures have a length ranging from 40 to 100 nm.

15. The semiconductor structure according to claim 1, wherein the semiconductor monocrystalline nanostructures have a ratio length on height ranging from 2 to 4.

16. The semiconductor structure according to claim 1, wherein the source and drain structures comprise a group IV semiconductor doped with one or more of Sb and Bi.

17. A method for forming a semiconductor structure according to claim 1, comprising:
providing a semiconductor substrate having a top surface;
providing a first semiconductor monocrystalline nanostructure and a second semiconductor monocrystalline nanostructure, each nanostructure having a first and a second extremity separated by a length of the nanostructure parallel to the top surface of the semiconductor substrate and separated therefrom by a non-zero distance; and
growing epitaxially on each first and second semiconductor monocrystalline nanostructures a source structure on the first extremity, and a drain structure on the second extremity,
wherein neither the source structure nor the drain structure of the first nanostructure contacts either the source structure or drain structure of the second nanostructures, and
wherein the source and drain structures of each nanostructure comprise a p-doped material that is different from the semiconductor monocrystalline material making the semiconductor monocrystalline nanostructure on which they are grown, thereby creating compressive strain in that semiconductor monocrystalline nanostructure, or wherein the source and drain structures of each nanostructure comprise an n-doped material that is different from the semiconductor monocrystalline material making the semiconductor monocrystalline nanostructure on which they are grown, thereby creating tensile strain in that semiconductor monocrystalline nanostructure.

18. The semiconductor structure according to claim 1, wherein the epitaxially grown source and drain structures comprise a p-doped semiconductor monocrystalline material having a first lattice constant and wherein the semiconductor monocrystalline nanostructures comprises a second semiconductor monocrystalline material having a second lattice constant that is larger than the first lattice constant.

19. The semiconductor structure according to claim 1, wherein the epitaxially grown source and drain structures comprise an n-doped material having a first lattice constant and wherein the semiconductor monocrystalline nanostructure are made of a second semiconductor monocrystalline material having a second lattice constant that is smaller than the first lattice constant.

20. The semiconductor structure according to claim 16, wherein the group IV semiconductor is further doped with one or more of As and P.

21. The semiconductor structure according to claim 1, wherein the source and drain structures comprise a group IV semiconductor doped with one or more of Sb and Bi and with one or more of As and P.

22. The semiconductor structure according to claim 1, wherein the compressive strain is present in three directions of the semiconductor monocrystalline nanostructure, and wherein the tensile strain in is present in three directions of the semiconductor monocrystalline nanostructure.

* * * * *